(12) United States Patent
Korta et al.

(10) Patent No.: US 12,460,880 B2
(45) Date of Patent: Nov. 4, 2025

(54) MANIFOLD FOR A COLDPLATE COOLING SYSTEM

(71) Applicant: Aptiv Technologies AG, Schaffhausen (CH)

(72) Inventors: Jakub Korta, Cracow (PL); Waldemar Wodecki, Cracow (PL); Lukasz Stanek, Cracow (PL); Tomasz Dolot, Cracow (PL); Grzegorz Puchala, Cracow (PL); Jakub Zborowski, Cracow (PL); Michal Wisniowski, Libiaz (PL); Marcin Pietras, Cracow (PL)

(*) Notice: Subject to any disclaimer, the term of this patent is extended or adjusted under 35 U.S.C. 154(b) by 140 days.

(21) Appl. No.: 18/392,479

(22) Filed: Dec. 21, 2023

(65) Prior Publication Data

US 2024/0210129 A1   Jun. 27, 2024

(30) Foreign Application Priority Data

Dec. 21, 2022 (EP) .................................... 22215658

(51) Int. Cl.
*F28F 9/02* (2006.01)
*H05K 7/20* (2006.01)

(52) U.S. Cl.
CPC ....... *F28F 9/0265* (2013.01); *H05K 7/20254* (2013.01); *H05K 7/20272* (2013.01)

(58) Field of Classification Search
CPC ...... F28F 9/0265; F28F 9/22; H05K 7/20254; H05K 7/20272
USPC ....................................................... 165/80.4
See application file for complete search history.

(56) References Cited

U.S. PATENT DOCUMENTS

| | | | | |
|---|---|---|---|---|
| 6,116,335 A | * | 9/2000 | Beamer ................. | F28F 21/067 165/174 |
| 8,418,931 B2 | * | 4/2013 | Meyer ...................... | F01P 7/16 165/297 |
| 10,845,135 B2 | | 11/2020 | Ranjan | |
| 11,015,872 B2 | * | 5/2021 | Aston ............... | H05K 7/20254 |
| 11,415,378 B2 | * | 8/2022 | Ranjan ..................... | F28F 9/22 |
| 2013/0257040 A1 | | 10/2013 | Kollar et al. | |
| 2020/0284190 A1 | * | 9/2020 | Sinha ..................... | B64D 33/02 |
| 2021/0247140 A1 | * | 8/2021 | Aston ................... | H01L 23/473 |
| 2024/0003634 A1 | * | 1/2024 | Bassani ................ | F28D 9/0075 |

FOREIGN PATENT DOCUMENTS

| | | | |
|---|---|---|---|
| DE | 102020125450 A1 | 3/2022 | |
| EP | 3943860 A1 | 1/2022 | |
| EP | 3587989 B1 * | 8/2023 | ......... H05K 7/20327 |
| FR | 2877080 A1 | 4/2006 | |

OTHER PUBLICATIONS

Extended European Search Report for EP Application No. 22215658.0, dated May 25, 2023, 8 pages.

* cited by examiner

*Primary Examiner* — Jon T. Schermerhorn, Jr.
(74) *Attorney, Agent, or Firm* — Miller Johnson (57) ABSTRACT

Disclosed is a coolant fluid manifold for coupling to a cold plate. The manifold includes an input channel including an inlet and an outlet. The inlet is configured to receive input coolant fluid. The input channel includes a guide element that projects from a wall of the input channel. The guide element is configured to guide fluid flow from the outlet.

11 Claims, 6 Drawing Sheets

MANIFOLD FOR A COLDPLATE COOLING SYSTEM

CROSS-REFERENCE TO RELATED APPLICATIONS

This application claims priority to EP App. No. 22 215 658 filed Dec. 21, 2022, the entire disclosure of which is incorporated by reference.

FIELD

The present disclosure generally relates to cold plate cooling systems and more particularly to a coolant fluid manifold for use in a cold plate cooling system.

BACKGROUND

Cold plate cooling systems are typically used to actively cool electronic components or electronic devices, for example within a vehicle.

The electronic systems within an automotive vehicle are becoming increasing numerous and complex, with vehicles often being equipped with multiple electronic systems to control various vehicle functionalities. Accordingly, domain control units (DCUs) are becoming more common, as the DCU controls a set of vehicle functions related to a specific area or domain. These systems (such as a DCU) include a high number of electronics which require cooling in order to function optimally. Liquid cooling with heat exchangers, where coolant flow absorbs heat from the electronics and transfers the heat away, is one of the most effective cooling system for electronics.

An example of a heat exchanger design that can be used in cooperation with liquid cooling systems is a plate heat exchanger. This is referred to in the present disclosure as a cold plate cooling system.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

There is a need to provide a more efficient and effective cold plate cooling system.

Aspects of the present disclosure are set out in the accompanying independent and dependent claims. Combinations of features from the dependent claims may be combined with features of the independent claims as appropriate and not merely as explicitly set out in the claims.

According to a first aspect of the present disclosure, there is provided a coolant fluid manifold for coupling to a cold plate, wherein the manifold comprises an input channel comprising an inlet and an outlet, the inlet configured to receive input coolant fluid, wherein the input channel comprises a guide element that projects from a wall of the input channel, wherein the guide element is configured to guide fluid flow from the outlet.

The guide element can advantageously guide fluid flow of the coolant fluid from the outlet to direct the coolant fluid in a given direction. This can provide more efficient cooling in selected cold plate regions.

The guide element may be configured to improve uniformity of fluid flow output from the input channel inlet.

The inlet may be in fluid communication with an inlet pipe for receiving input coolant fluid.

Optionally, the manifold may comprise a return channel comprising an inlet and an outlet. The outlet may be in fluid communication with an outlet pipe for outputting returned coolant fluid. The return channel may be adjacent to the input channel.

It will be appreciated that both the input channel and the output channel receive and output coolant fluid during use. The input channel inlet in the present disclosure receives coolant fluid 'input' into the cooling system.

In use, the output channel in the present disclosure receives coolant fluid that is output from the input channel and has passed through the cold plate. The output channel then outputs this returned coolant fluid, for example via an output pipe. The present disclosure is mainly concerned with the input channel. It will be appreciated that the output channel may have the same configuration as the input channel, but without the guide element.

Optionally, the guide element partially occludes or blocks the input channel outlet.

Optionally, a gap is provided between the guide element and a top wall or a base wall of the input channel.

Optionally, the guide element has a height that is approximately half a height of the input channel.

Thus, the input channel may have a first height and the guide element may have a maximum height equal to a second height, wherein the second height is less than the first height. Thus, the guide element may not block the entire height of the input channel, such that an amount of fluid flow is permitted between the guide element and a base or top wall of the input channel. Optionally, the second height is approximately half the first height.

The height of the guide element may vary across the width of the guide element.

Optionally, the guide element has a leading contact surface and a trailing contact surface. The leading contact surface may project from a top wall or a base wall of the input channel. The leading contact surface may extend from the input channel outlet to a sidewall of the input channel.

Optionally, the trailing contact surface tapers from the leading contact surface towards a sidewall of the input channel.

Optionally, the leading contact surface is inclined at a steeper angle than the trailing contact surface relative to the wall of the input channel from which the guide element projects.

Optionally, the leading contact surface is inclined at an angle between 75° and 105° with respect to the wall of the input channel from which the guide element projects. In some embodiments, the leading contact surface may be perpendicular to the top wall or base wall of the input channel.

Optionally, the leading contact surface may have a height equal to the second height. The height of the trailing contact surface may taper towards a sidewall of the input channel.

Optionally, the guide element may comprise a fin or rib projection. The guide element may have a wedge shape, or a curved wedge shape. The guide element may be a three-dimensional structure.

The guide element may be shaped and/or positioned to direct fluid flow from the input channel inlet towards a center or a midpoint of the input channel outlet. This may improve uniformity of the fluid flow output if there is an uneven distribution of fluid flow from the inlet towards an edge of the input channel inlet. The guide element may limit the amount of fluid flow towards that edge of the input channel.

The input channel may have a width defined between a first sidewall and a second sidewall. The guide element may project from a top wall or a base wall of the input channel at a position between the first sidewall and the second sidewall.

The guide element may, proximate the outlet, project from a top wall or a base wall of the input channel at a position between a midpoint of the first and second sidewalls, and the first or second sidewall. The guide element may be offset from the input channel inlet.

The guide element may extend along the entire length of the input channel from the position proximate the outlet between the midpoint of the first and second sidewalls, and the first or second sidewall, towards the inlet.

Optionally, the guide element may extend along substantially the entire length of the input channel.

The input channel may have a first (or maximum) length extending from the outlet to the inlet. The guide element may have a second length that that is less than the first length. The second length may be parallel to the first length.

Optionally, a lateral cross-section of the input channel may have a v-shape, or a curved v-shape.

The input channel may have a first sidewall and a second sidewall that each extend from the input channel outlet to a vertex. The input channel inlet may be provided proximate the vertex.

Optionally, the guide element is offset from the input channel inlet, such that the guide element may not be aligned with the vertex.

Optionally, proximate the inlet channel outlet the leading contact surface projects from a top wall or a base wall of the input channel at a position between the first sidewall and a midpoint between the first sidewall and the second sidewall. The leading contact surface may extend along a length of the input channel towards the input channel inlet until it contacts to the first sidewall.

The leading contact surface may be approximately perpendicular to the plane of the input channel outlet.

Optionally, the input channel outlet has a first width. The first width may be defined as the distance between the first sidewall and the second sidewall at the outlet.

The guide element may have a second width at the outlet that is less than the first width. Optionally, the second width may be approximately a third of the first width.

In a second aspect, the present disclosure provides a cold plate cooling system comprising the manifold of any of embodiment or example of the first aspect of this disclosure and a cold plate.

It will be appreciated that a cold plate is a well-known term of the art for a plate which is actively cooled by a coolant system. It will be appreciated that any type of cold plate may be provided.

Optionally, the cold plate comprises a body, an input flow passage configured to interface with the input channel outlet, and a return flow passage configured to interface with the return channel inlet, wherein the input flow passage and the return flow passage each extend longitudinally through the body of the cold plate, and a return manifold coupled to the input flow passage and the return flow passage, such that a fluid flow path extends from the input channel inlet to the return channel outlet.

Optionally, the guide element is shaped and positioned to at least partially deflect coolant fluid towards an inner wall of the cold plate. Thus, a higher ratio of coolant fluid may be directed towards the inner wall which may more effectively cool the cold plate and improve efficiency of the cooling system.

Optionally, the input flow passage comprises at least a first passage and a second passage.

Optionally, the inner wall extends longitudinally through the body of the cold plate and at least partially separates the first passage from the second passage.

Optionally, the second passage is adjacent the first passage.

In some embodiments, the input flow passage comprises three or more passages. The three or more passages may be at least partially separated from each other by a plurality of inner walls. Optionally, a plurality of guide elements may be provided, wherein each guide element at least partially deflects coolant fluid towards a respective one of the plurality of inner walls.

Optionally, the second passage comprises an outer wall and the inner wall, wherein the outer wall forms part of the body of the cold plate. The guide element may be shaped and positioned to deflect flow of the coolant fluid in the second passage away from the outer wall. By directing fluid flow away from an exterior wall of the cold plate this may more effectively cool the cold plate and improve efficiency of the cooling system.

Optionally, the inner wall is aligned with the input channel inlet.

Optionally, the cooling system may comprise a plurality of cold plates.

The manifold may comprise a plurality of input channels and outlet channels to interface with the plurality of cold plates. Optionally, a plurality of manifolds may be provided.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

Embodiments of this disclosure will be described hereinafter, by way of example only, with reference to the accompanying drawings.

In the drawings, reference numbers may be reused to identify similar and/or identical elements.

DETAILED DESCRIPTION

Embodiments of this disclosure are described in the following with reference to the accompanying drawings.

Figure 1:
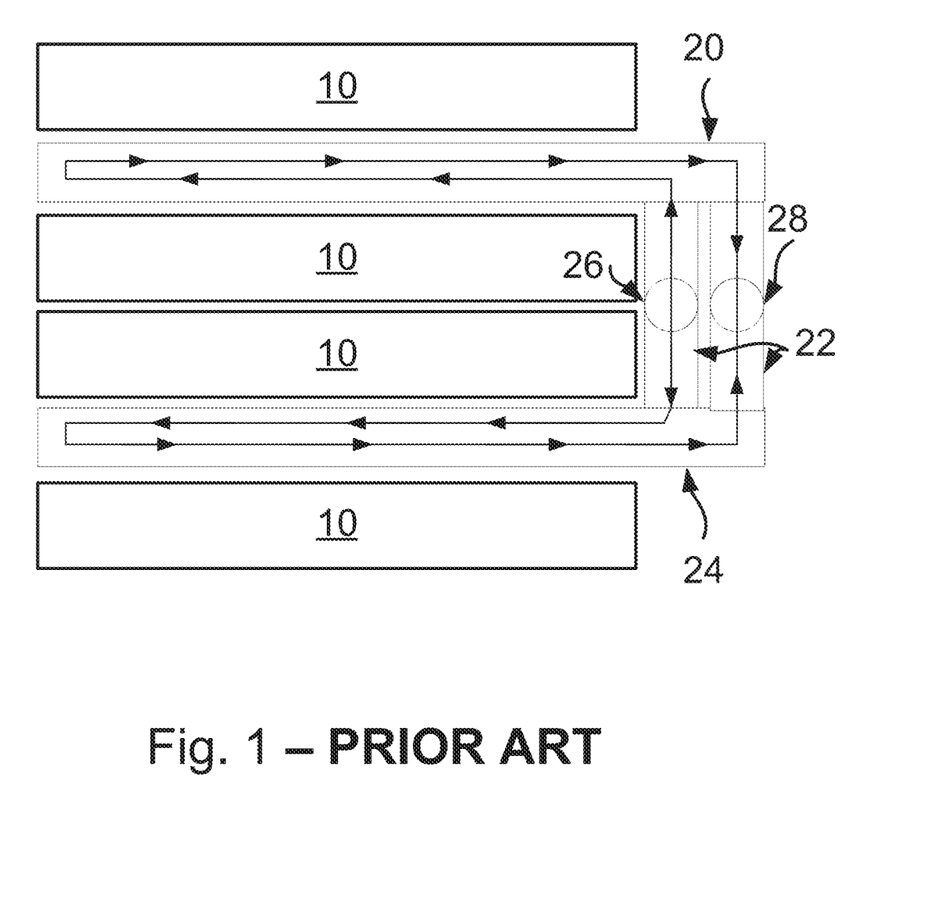
FIG. 1 shows an embodiment of a cooling system according to the prior art.

FIG. 1 shows an example of a cooling system according to the prior art for cooling a plurality of electronic controllers, or electronic components, 10. The cooling system comprises a first cold plate 20 and a second cold plate 24 positioned between a respective pair of the electronic controllers 10. A thermal interface material (not shown) may be provided between the electronic controllers 10 and the cold plates 20, 24.

At least one manifold is provided to circulate coolant fluid through internal channels in the cold plates 20, 24 to actively cool the electronic controllers 10. In the example shown in FIG. 1, the manifold 22 comprises an inlet 26 and an outlet 28. The inlet 26 is configured to receive input coolant fluid and to output the coolant fluid to the first and second cold plates 20, 24. The inflow stream of coolant fluid from the inlet 26 to the first and second cold plates 20, 24 is shown by the arrows extending from the inlet 26 in FIG. 1. The coolant fluid then returns via an outflow stream (as shown by the arrows) to the outlet 28, wherein the coolant fluid is output from the system.

This type of heat exchanger (or cooling system) is compact and therefore useful in automotive design, and other types of system which are typically characterized by tight assembly spaces.

Ideally, the first and second cold plates 20, 24 provide the same cooling performance. However, in practice this is often not achieved, as the flow of coolant fluid through the cold plates can be uneven, which can reduce the efficiency and efficacy of the cooling process. The present disclosure seeks to remedy this deficiency.

Figure 2:
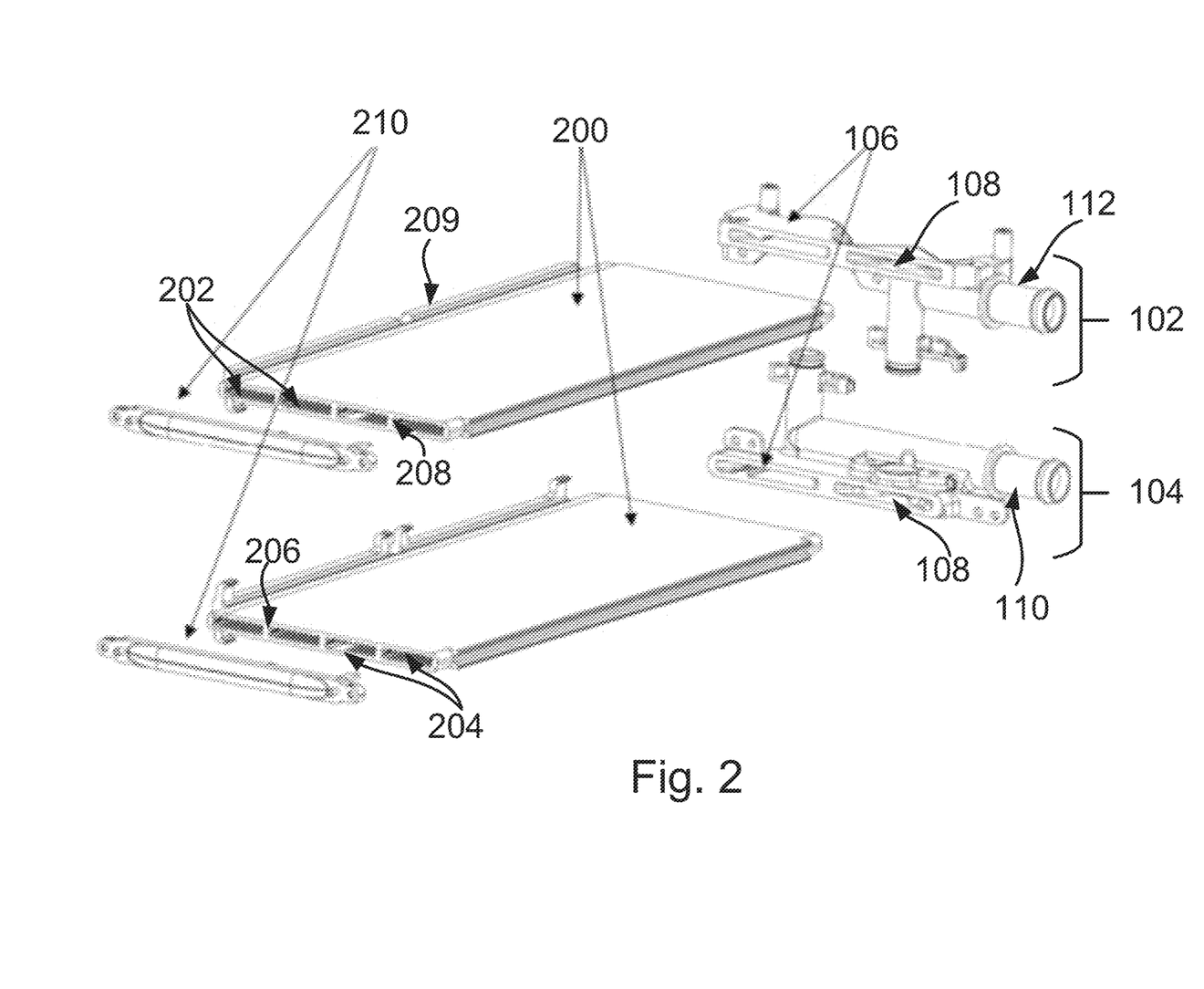
FIG. 2 shows an exploded view of a cooling system according to an embodiment of this disclosure.
Figure 3:
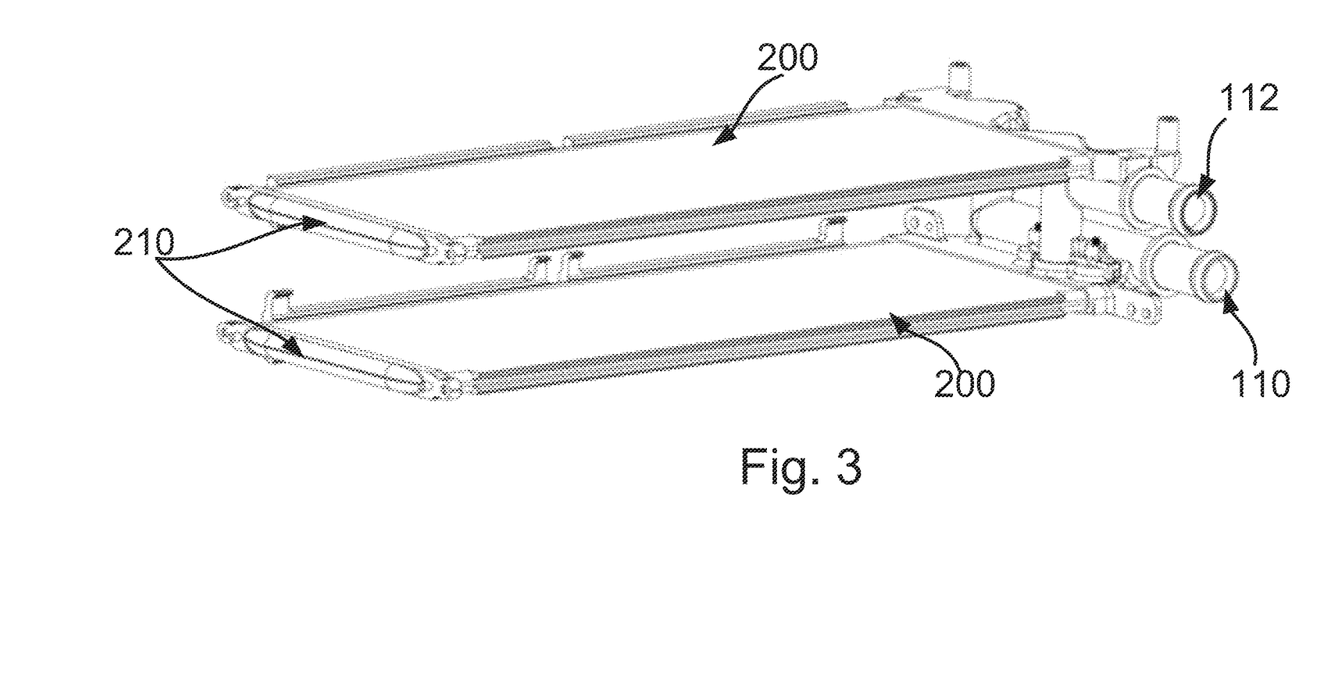
FIG. 3 shows the cooling system of FIG. 2 when assembled for use.

FIG. 2 shows an exploded view of a cooling system according to an embodiment of this disclosure. FIG. 3 shows the cooling system of FIG. 2 when assembled. The cooling system may be provided in an automotive vehicle.

In this embodiment, the cooling system comprises a first manifold 102 and a second manifold 104 and two cold plates 200. In some embodiments, the first and second manifold 102, 104 may be a single manifold. In some embodiments only, a single cold plate 200 may be provided.

Each manifold 102, 104 comprises an input channel 106 and an output channel 108. The first manifold 102 comprises an outlet pipe 112 and the second manifold 104 comprises an inlet pipe 110. In other embodiments, the first manifold 102 comprises the inlet pipe 110 and the second manifold 104 comprises the outlet pipe 112. The inlet pipe 110 is configured to receive the input coolant fluid and the outlet pipe 112 is configured to output the returned coolant fluid from the system.

In this embodiment, each cold plate 200 comprises two internal input passages 202 and two internal output passages extending longitudinally through the body of the cold plate 200 (see FIG. 2). The pair of input passages 202 are adjacent to the pair of output passages 204. Each of the input passages 202 are separated by a first internal wall 206, and each of the output passages 204 are separated by a second internal wall 208. The input passages 202 are separated from the output passages by a further internal wall.

The input passages 202 in a respective cold plate 200 are configured to interface with a respective one of the input channels 106 in the manifolds 102, 104, when the system is assembled (as shown in FIG. 3). Similarly, the outlet passages 204 in a respective cold plate 200 are configured to interface with a respective one of the output channels 108 in the manifolds 102, 104. Two return manifolds 210 are also provided.

When assembled, as shown in FIG. 3, each return manifold 210 fluidly couples the input passages 202 to the output passages 204 for a given one of the cold plates. Thus, in use, a fluid flow path for coolant fluid is established from the inlet pipe 110, through the input channel 106, the input passages 202, the return manifold 210, the output passages 204, the output channel 108 and out of the output pipe 112.

Figure 4:
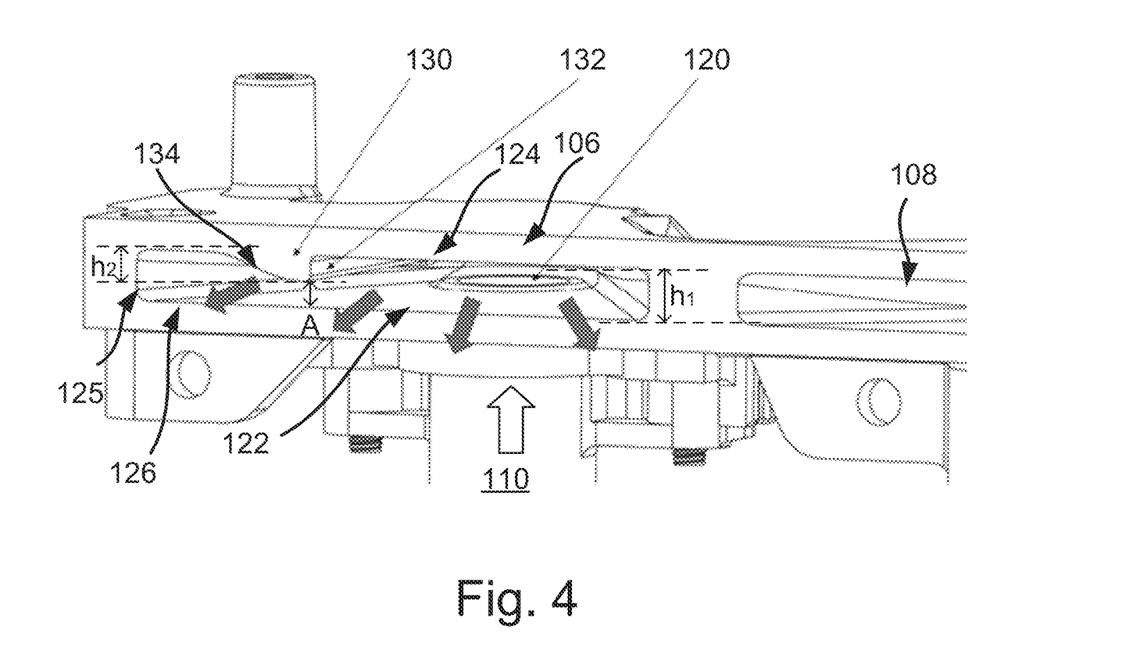
FIG. 4 shows a front perspective view of a portion of a manifold according to an embodiment of this disclosure.

FIG. 4 shows a more detailed view of an input channel of a coolant fluid manifold according to an embodiment of this disclosure. Features which are common between FIGS. 2 and 4 have been given the same reference numeral.

In FIG. 4, the input channel 106 comprises an inlet 120 and an outlet 122. In this embodiment, the inlet 120 is provided in a top wall 124 of the input channel 106. In other embodiments, the inlet 120 may be, for example, in the bottom wall or base 126 of the input channel 106. The inlet 120 is in fluid communication with the inlet pipe 110 which is configured to receive input coolant fluid. The flow of coolant fluid during use of the manifold is illustrated in FIG. 4 by the arrows. The outlet 122 is the outwards facing aperture of the input channel 106. Thus, during use, coolant fluid flows from the inlet pipe 110, through the inlet 120, along the input channel 106 and out through the outlet 122 into the cold plate 200.

A guide element 130 is provided to guide the flow of coolant fluid from the input channel outlet 122. In FIG. 4, the guide element 130 projects from the top wall 124 of the input channel 106. In other embodiments, the guide element 130 may project from the base 126, or a sidewall of the input channel 106.

The guide element 130 is (or comprises) a fin or rib shaped projection. In this embodiment, the guide element 130 has a leading contact surface 132 and a trailing contact surface 134. The maximum height of the guide element 130 is provided by the leading contact surface 132.

As shown in FIG. 4, the guide element 130 has a maximum height of h2. The maximum height may be provided by the leading contact surface 132. The input channel has a height of h1, wherein h1 is greater than h2. In some embodiments, h2 may be approximately half of h1. Accordingly, the guide element 130 does not extend across the entire height of the input channel 106 from the top wall 124 to the bottom wall 126. Instead, a gap A is provided between the leading contact surface 132 and the bottom wall 126 of the input channel 106. Thus, some amount of fluid flow is permitted underneath the guide element 130.

Without the guide element 130 a high proportion of the coolant fluid output from the outlet 122 can flow towards the outer wall 209 of the cold plate (see FIG. 2). As the fluid flow is not uniform this results in a decrease in the efficiency of the cooling system, as some areas of the cold plate 200 are cooled more than others. Thus, the guide element 130 is configured to redirect fluid flow towards the center or midpoint of the outlet 122 and to reduce the amount of fluid flow output from the portion of the outlet 122 proximate the first sidewall 125. Thus, a higher ratio of the coolant fluid is output towards the center or midpoint of the outlet 122 and the guide element 130 can ensure a more uniform distribution of the coolant flow, thereby improving cooling performance.

In some embodiments, due to the guide element 130 the fluid flow output from the outlet 122 may not be uniform, but may be skewed towards outputting a higher proportion of fluid proximate the center or midpoint of the outlet 122. A higher portion of the output fluid may flow in a direction substantially perpendicular to the plane of the outlet 122.

It will be appreciated that the flow of coolant fluid from the outlet 122 at least partially depends on the operational parameters of the coolant system, such as the pressure and temperature of the coolant fluid. It will also be appreciated that the guide element 130 is not limited to the position or configuration shown in these figures. Instead, the guide element 130 can be shaped and/or positioned to guide fluid flow from the outlet 122 in any desired direction to improve efficiency of the cooling and/or at least partially correct flow abnormalities, depending on the particular requirements of the coolant system.

In this embodiment, the leading contact surface 132 is inclined at a steeper angle than the trailing contact surface 134 relative to the top wall 124 of the input channel. In this non-limiting example, the leading contact surface is orientated at an angle between 75° and 105° from the top wall 124 of the input channel, but this angle can vary. For example, depending on operational parameters. The trailing contact surface 134 tapers or curves from the leading contact surface 132 towards a sidewall of the input channel 106. This is shown in more detail in FIGS. 5 and 6.

Figure 5:
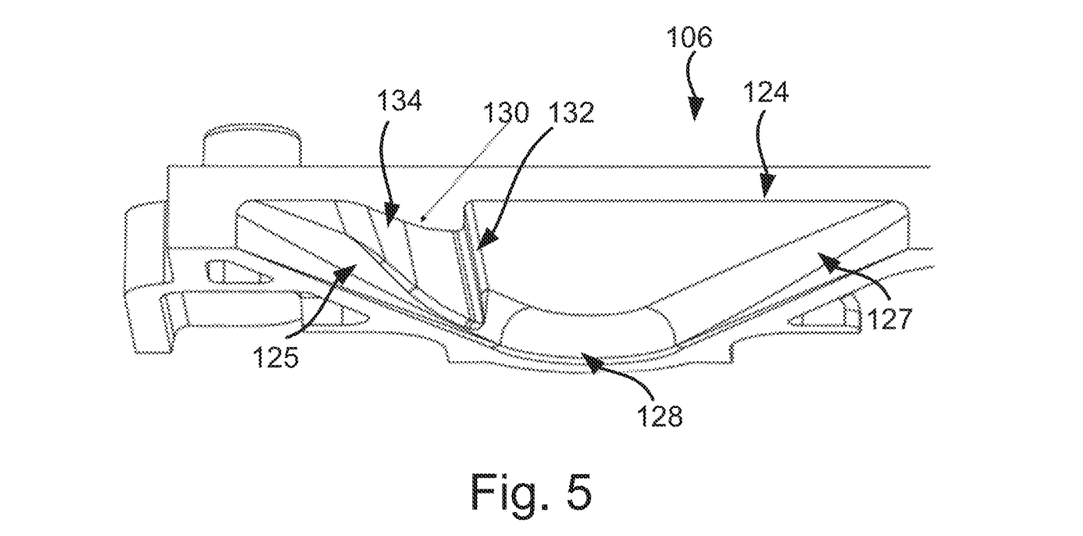
FIG. 5 shows bottom perspective view of a lateral cross-section of the input channel in FIG. 4.

FIG. 5 shows a bottom perspective view of a lateral cross-section of the input channel 106 in FIG. 4. The inlet 120 is not shown in FIG. 5. The input channel 106 has a generally v-shaped, or curved v-shaped, lateral cross-section. A first sidewall 125 and a second sidewall 127 of the input channel extend from the outlet 122 to a vertex 128. The three-dimensional shaping of the guide element 130 is clearly shown in FIG. 5. The leading contract surface 132 is substantially vertical. The trailing contact surface 134 extends from the leading contact surface 132 and tapers the guide element 130 towards the first sidewall 125.

Again, it will be appreciated that the guide element 130 could be used with any size or shape input channel, and is not limited to the v-shaped input channel 102 shown in the arrangements of the accompanying figures.

Figure 6:
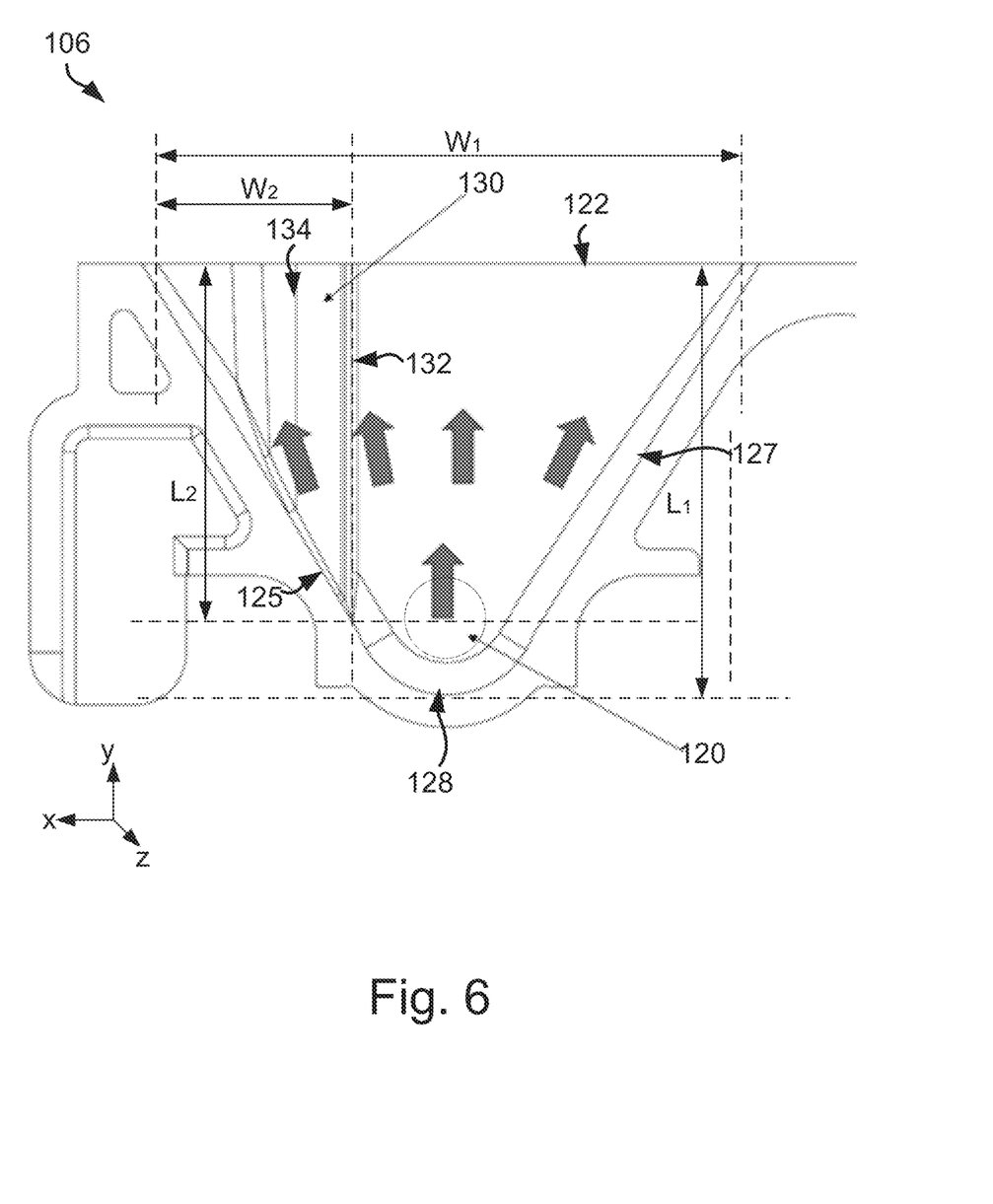
FIG. 6 shows a lateral cross-section of an input channel when viewed from the underside or bottom of the input channel according to an embodiment of this disclosure.

FIG. 6 shows a lateral cross-section of the input channel 106 (e.g. as shown in FIG. 5) when viewed from the underside or bottom of the input channel. The leading contact surface 132 of the guide element extends from the outlet 122 to the first sidewall 125, wherein the leading contact surface 132 is approximately perpendicular to the plane of the outlet 122. As shown, the leading contact surface 132 is spaced from, or offset from, the inlet 120 and the vertex 128.

The width of the input channel 106 is defined as the distance between the sidewalls 125, 127 in the x-direction in FIG. 6. The length of the input channel 106 is defined as the distance in the y-direction in FIG. 6. The height of the input channel 106 (as shown in FIG. 5) corresponds to the distance in the z-direction in FIG. 6.

The input channel 106 has a maximum width W1 (referred to as the first width) at the outlet 122, wherein the width of the v-shaped input channel 106 narrows towards the vertex 128. The maximum width of the guide element 130, W2, (referred to as the second width) is also proximate the outlet 122. As shown, W2 is less than half of W1. In this embodiment, the second width W2 is approximately a third of the first width W1.

In this embodiment, the lateral cross-section of the guide element 130 is shaped approximately like a right-angled triangle, with a portion of the first sidewall 125 forming the hypotenuse.

The input channel 106 has a maximum length L1 from the outlet 122 to the vertex 128. The length of the input channel 106 narrows towards the edges of the outlet 122. The maximum length of the guide element 130 is at the leading contact surface 134. The leading contact surface 132 has a length L2, wherein L2 is less than L1.

The flow direction of coolant fluid from the inlet 120 towards the outlet 122 is represented by the arrows in FIG. 6. Accordingly, the guide element 130 partially blocks fluid flow from the inlet towards the first sidewall 125, but some fluid flow is permitted underneath the guide element 130 (e.g. through gap A in FIG. 4). Thus, the coolant fluid is partially redirected by the guide element 130 towards the midpoint of the width W1 of the outlet 122.

Figure 7A:
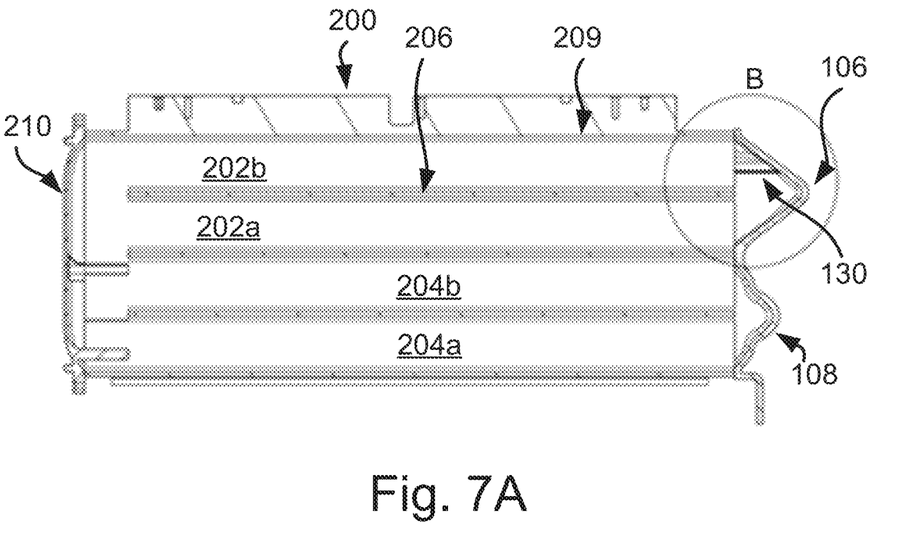
FIG. 7A shows a lateral cross section through an assembled cooling system according to an embodiment of this disclosure.
Figure 7B:
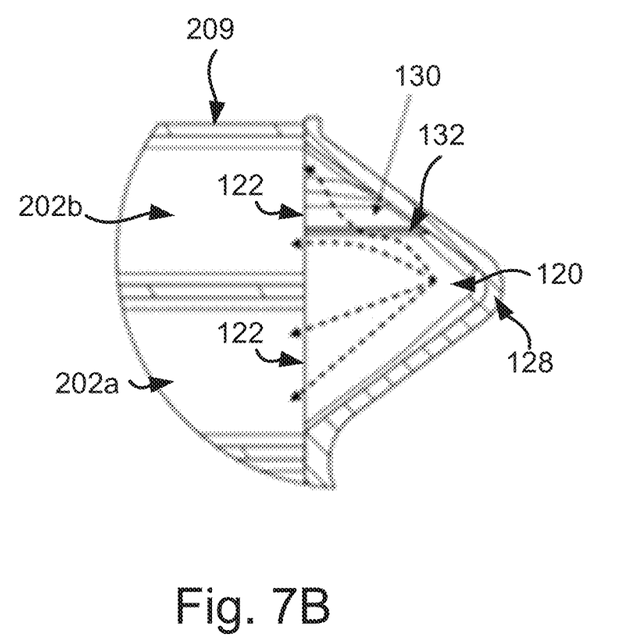
FIG. 7B is a close up of section B in FIG. 7A.

As shown in FIGS. 7A and B, in this embodiment the guide element 130 therefore functions to direct flow of the coolant fluid towards the inner wall 206 between the inlet passages 202 of the cold plate. FIG. 7A shows a lateral cross section through the assembled cooling system (e.g. through the top cold plate in FIG. 3). The input channel 106 interfaces with a first input passage 202a and a second input cooling passage 202b through the cold plate 200. The output passage 108 interfaces with a first output passage 204a and a second output passage 204b through the cold plate 200.

The guide element 130 is shaped and positioned to direct at least a portion of the input coolant flow from away from an outer (or exterior) wall 209 of the cold plate. This is shown in more detail in FIG. 7B, which is a close up of section B in FIG. 7A. In FIG. 7B the dotted lines represent the flow of the coolant fluid from the inlet 120 towards the outlet 122 of the input channel 106.

In FIG. 7A an 7B, the inner wall 206 which separates the two input passages 202 is substantially aligned with the inlet 120 and the vertex 128 of the input channel 106. The guide element 130 interfaces with the second input passage 202b. As described above, the guide element 130 may extend from either the top wall or the bottom wall of the input channel 106. In this embodiment, the shape and position of the guide element 130 at least partially deflects flow of the coolant fluid from the outlet 122 towards the inner wall 206. Some coolant fluid is permitted to flow under or over the guide element 130 (as shown by the dotted lines) towards the outer wall 209 of the cold plate, but fluid flow in this direction is reduced by the guide element.

The guide element 130 may not affect fluid flow from the outlet 122 to the first input passage 202a. In some embodiments, the guide element 130 may increase the fluid flow to the first input passage 202a.

It is advantageous to have increased flow of coolant fluid towards the inner wall 206 of the cold plate 200, as this has been found to cool the cold plate 200 more effectively and therefore improve performance of the cooling system.

In other embodiments, the guide element 130 may at least partially deflect flow of the coolant fluid in another direction to improve uniformity of flow, or to improve the efficiency of the cooling system, depending on the operational parameters of the system and the construction of the cold plate and the manifold. Thus, the guide element 130 is not limited to directing fluid flow towards an inner wall of the cold plate.

The guide element 130 can also reduce or eliminate unwanted vortices in the region of the input channel 106, by reducing the fluid flow towards the outer wall 209. These vortices can occur due to the particular inner geometry of the cold plate. Reduction of vortices advantageously makes the coolant flow smoother, improves the heat exchange effect and can lead to lower pressure drop.

It will be appreciated that the present disclosure is not limited to the particular cold plate shown in the arrangements of the accompanying figures. Instead, the manifold of the present disclosure could be used with any type of cold plate. Accordingly, although the cold plate 200 is shown as comprising two input passages 202a 202b and two output passages 204a 204b, any number of input and output passages may be provided. The number of input passages may not be equal to the number of output passages.

In some embodiments the cold plate may comprise a plurality of inner walls that separate a plurality of input passages. Thus, the input channel 102 may comprise a plurality of guide elements 130. In some embodiments, the number of guide elements provided may equal the number of inner walls provided in the cold plate.

Accordingly, there has been described a coolant fluid manifold for coupling to a cold plate, wherein the manifold comprises an input channel comprising an inlet and an outlet, the inlet in fluid communication with an inlet pipe for receiving input coolant fluid, and a return channel comprising an inlet and an outlet, the outlet in fluid communication with an outlet pipe for outputting returned coolant fluid, wherein the input channel comprises a guide element that projects from a wall of the input channel, wherein the guide element is configured to guide fluid flow output from the input channel outlet. The guide element may direct fluid flow towards an inner wall of the cold plate.

Although particular embodiments of this disclosure have been described, it will be appreciated that many modifications/additions and/or substitutions may be made within the scope of the claims.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A coolant fluid manifold for coupling to a cold plate, the coolant fluid manifold comprising:
   an input channel including an inlet and an outlet, wherein:
      the inlet is configured to receive input coolant fluid,
      the input channel includes a guide element configured to guide fluid flow from the outlet, and
      the guide element includes:
         a leading contact surface projecting from a top wall or a base wall of the input channel substantially perpendicular to a plane of the outlet, and leaving a gap between the guide element and the base wall or the top wall respectively,
         a trailing contact surface tapering from the leading contact surface toward a sidewall of the input channel, and
      shape and position of the leading contact surface and the trailing contact surface are configured to skew fluid flow from the inlet toward outputting a higher proportion of fluid proximate a center or a midpoint of the outlet while limiting fluid flow toward an edge of the input channel that corresponds to an outer wall of the cold plate.

2. The coolant fluid manifold of claim 1 wherein the guide element has a height that is approximately half a height of the input channel.

3. The coolant fluid manifold of claim 1 wherein the leading contact surface is inclined at a steeper angle than the trailing contact surface relative to the wall of the input channel wherefrom the guide element projects.

4. The coolant fluid manifold of claim 1 wherein:
   a lateral cross-section of the input channel has at least one of a v-shape or a curved v-shape;
   the input channel includes a first sidewall and a second sidewall that each extend from the outlet to a vertex;
   the inlet is provided proximate the vertex; and
   the leading contact surface extends from the outlet to the first sidewall.

5. The coolant fluid manifold of claim 4 wherein the guide element is offset from the inlet.

6. The coolant fluid manifold of claim 1 wherein the guide element includes a fin or rib projection.

7. The coolant fluid manifold of claim 1 further comprising a return channel including a return channel inlet and a return channel outlet.

8. A cold plate cooling system comprising:
   the coolant fluid manifold of claim 7; and
   the cold plate, wherein the cold plate includes:
      a body;
      an input flow passage configured to interface with the outlet; and
      a return flow passage configured to interface with the return channel inlet, wherein:
         the input flow passage and the return flow passage each extend longitudinally through the body of the cold plate, and
         a return manifold coupled to the input flow passage and the return flow passage, such that a fluid flow path extends from the inlet to the return channel outlet.

9. The cold plate cooling system of claim 8, wherein the guide element is shaped and positioned to at least partially deflect coolant fluid toward an inner wall of the cold plate.

10. The cold plate cooling system of claim 9, wherein:
    the input flow passage includes at least a first passage and a second passage; and
    the inner wall extends longitudinally through the body of the cold plate and at least partially separates the first passage from the second passage.

11. The coolant fluid manifold of claim 1 wherein the guide element, by virtue of the leading contact surface and the trailing contact surface respectively, has a wedge shape or a curved wedge shape.

* * * * *